United States Patent [19]

Mehrotra et al.

[11] Patent Number: 5,365,102
[45] Date of Patent: Nov. 15, 1994

[54] SCHOTTKY BARRIER RECTIFIER WITH MOS TRENCH

[75] Inventors: Manoj Mehrotra; Bantval J. Baliga, both of Raleigh, N.C.

[73] Assignee: North Carolina State University, Raleigh, N.C.

[21] Appl. No.: 88,204

[22] Filed: Jul. 6, 1993

[51] Int. Cl.$^5$ ............... H01L 27/095; H01L 29/48
[52] U.S. Cl. ..................... 257/475; 257/471
[58] Field of Search ............ 257/471, 475, 476, 480, 257/481, 482, 267, 264, 655, 656, 603

[56] References Cited

U.S. PATENT DOCUMENTS 4,641,174  2/1987  Baliga ........................... 257/264
4,982,260  1/1991  Chang et al. .................. 257/656

FOREIGN PATENT DOCUMENTS 52-32677  3/1977  Japan ............................. 257/475

OTHER PUBLICATIONS

"Modern Power Devices" by Baliga, 1987, pp. 67–69.
A. S. Grove, "Physics and Technology of Semiconductor Devices," 1967, pp. 191–201.
John P. McKelvey, "Solid State and Semiconductor Physics," 1982, pp. 390–428.
Optimization of the MPS Rectifier Via Variation of Schottky Region, Area, Tu et al., Proceedings of the 3rd International Symposium on Power Semiconductor Devices and ICs, Apr. 22–24, 1991, pp. 109–112.
Modern Power Devices, B. J. Baliga, John Wiley & Sons, Inc., 1987, pp. 421–450.
Analysis of a High-Voltage Merged p-i-n/Schottky (MPS) Rectifier, B. J. Baliga, IEEE Electron Device Letters, vol. EDL-8, No. 9, 1987, pp. 407–409.
The Merged P-I-N Schottky (MPS) Rectifier: A High--Voltage, High-Speed Power Diode, B. J. Baliga et al.; Proceedings of the IEDM—International Electron Devices Meeting, Washington, DC, Dec. 1987, pp. 658–661.
New Concepts in Power Rectifiers, B. J. Baliga, Proceedings of the Third International Workshop on the Physics of Semiconductor Devices, Nov. 27–Dec. 2 (Madras), World Scientific Publications, 1985.

*Primary Examiner*—Steven Ho Yin Loke
*Attorney, Agent, or Firm*—Bell, Seltzer, Park & Gibson

[57] ABSTRACT

A trench MOS Schottky barrier rectifier includes a semiconductor substrate having first and second faces, a cathode region of first conductivity type at the first face and a drift region of first conductivity type on the cathode region, extending to the second face. First and second trenches are formed in the drift region at the second face and define a mesa of first conductivity type therebetween. The mesa can be rectangular or circular in shape or of stripe geometry. Insulating regions are defined on the sidewalls of the trenches, adjacent the mesa, and an anode electrode is formed on the insulating regions, and on the top of the mesa at the second face. The anode electrode forms a Schottky rectifying contact with the mesa. The magnitude of reverse-biased leakage currents in the mesa and the susceptibility to reverse breakdown are limited not only by the potential barrier formed by the rectifying contact but also by the potential difference between the mesa and the portion of anode electrode extending along the insulating regions. Moreover, by properly choosing the width of the mesa, and by doping the mesa to a concentration greater than about $1 \times 10^{16}$ per cubic centimeters, reverse blocking voltages greater than those of a corresponding parallel-plane P-N junction rectifier can be achieved.

18 Claims, 9 Drawing Sheets

SCHOTTKY BARRIER RECTIFIER WITH MOS TRENCH

FIELD OF THE INVENTION

This invention relates to rectifiers and more particularly to metal-semiconductor rectifying devices, and methods of fabricating these devices.

BACKGROUND OF THE INVENTION

Schottky barrier rectifiers are used extensively as output rectifiers in switching-mode power supplies and in other high-speed power switching applications such as motor drives, for carrying large forward currents and supporting high reverse blocking voltages. As is well known to those having skill in the art, a two-terminal rectifier exhibits a very low resistance to current flow in a forward direction and a very high resistance to current flow in a reverse direction. As is also well known to those having skill in the art, a Schottky barrier rectifier produces unipolar rectification as a result of nonlinear current transport across a metal-semiconductor contact.

There are basically four distinct process for the transport of predominantly unipolar charge carriers across a metal/N-type semiconductor contact. The four processes are (1) transport of electrons from the semiconductor over a metal/semiconductor potential barrier and into the metal (thermionic emission), (2) quantum-mechanical tunneling (field emission) of electrons through the barrier, (3) recombination in the space-charge region and (4) hole injection from the metal to the semiconductor. In addition, edge leakage currents, caused by high electric fields at the metal contact periphery as well as interface currents, caused by the presence of traps at the metal-semiconductor interface, may also be present.

Current flow by means of thermionic emission (1) is the dominant process for a Schottky power rectifier with a moderately doped semiconductor region (e.g., Si with doping concentration $\leq 1 \times 10^{16}/cm^3$), operated at moderate temperatures (e.g., 300K). Moderate doping of the semiconductor region also produces a relatively wide potential barrier between the metal and semiconductor regions and thereby limits the proportion of current caused by tunneling (2). Space-charge recombination current (3) is similar to that observed in a P-N junction diode and is significant only at very low forward current densities. Finally, current transport due to minority carrier injection (4) is significant only at large forward current densities.

As the voltages of modern power supplies continue to decrease in response to need for reduced power consumption and increased energy efficiency, it becomes more advantageous to decrease the on-state voltage drop across a power rectifier, while still maintaining high forward-biased density levels. As well known to those skilled in the art, the on-state voltage drop is dependent on the forward voltage drop across the metal/semiconductor junction and the series resistance of the semiconductor region and cathode contact.

The need for reduced power consumption also requires minimizing the reverse-biased leakage current. The reverse-biased leakage current is the current in the rectifier during reverse-biased blocking mode of operation. To sustain high reverse-biased blocking voltages and minimize reverse-biased leakage currents, the semiconductor portion of the rectifier is typically lightly doped and made relatively thick so that the reverse-biased electric field at the metal/semiconductor interface does not become excessive. The magnitude of the reverse-biased leakage current for a given reverse-biased voltage is also inversely dependent on the Schottky barrier height (potential barrier) between the metal and semiconductor regions. Accordingly, to achieve reduced power consumption, both the forward-biased voltage drop and reverse-biased leakage current should be minimized and the reverse blocking voltage should be maximized.

Unfortunately, there is a tradeoff between the forward-biased voltage drop and the reverse-biased leakage current in a Schottky barrier rectifier, so that it is difficult to minimize both characteristics simultaneously. In particular, as the Schottky barrier height is reduced, the forward voltage drop decreases but the reverse-biased leakage current increases. Conversely, as the barrier height is increased, the forward voltage drop increases but the leakage current decreases. The doping level in the semiconductor region also plays a significant role. The higher the doping level, the lower the forward-biased voltage drop but reverse-biased breakdown is reduced by impact-ionization.

Therefore, in designing Schottky barrier rectifiers, design parameters such as barrier heights and semiconductor doping levels are selected to meet the requirements of a particular application because all device parasitics cannot be simultaneously minimized. Low barrier heights are typically used for Schottky rectifiers intended for high current operation with large duty cycles, where the power losses during forward conduction are dominant. High barrier heights are typically used for Schottky rectifiers intended for applications with higher ambient temperatures or requiring high reverse blocking capability.

The height of the Schottky barrier formed by the metal/semiconductor junction is related to the work function potential difference between the metal contact and the semiconductor substrate. A graphical illustration of the relationship between metal work function and Schottky barrier height may be found in Chapter 5, FIG. 3 of the textbook by S. M. Sze entitled *Semiconductor Devices, Physics and Technology*, John Wiley & Sons, 1985, at page 163. A detailed and comprehensive discussion of the design of Schottky barrier power rectifiers may be found in Section 8.2 of the textbook entitled *Modern Power Devices* by coinventor Baliga, published by John Wiley and Sons, Inc., 1987, the disclosure of which is hereby incorporated herein by reference.

In particular, sections 8.2.1 and 8.2.2 of the Baliga textbook disclose the semiconductor physics associated with both forward conduction and reverse blocking in a parallel-plane Schottky rectifier having the structure of FIG. 8.13 of the Baliga textbook. As set forth in Equation 8.14, the forward voltage drop is dependent on the drift region, substrate and contact resistances ($R_D$, $R_S$ and $R_C$), as well as the forward current density ($J_F$) and saturation current ($J_S$), which is a function of the Schottky barrier height ($\theta_{Bn}$). The maximum reverse blocking voltage (i.e., breakdown voltage) of a Schottky rectifier ($BV_{pp}$) is also disclosed as ideally being equal to that of a one-sided abrupt P-N junction rectifier (e.g., P+-N or N+-P), having the structure of FIG. 3.3 of the Baliga textbook. The breakdown voltage $BV_{pp}$ is dependent on the doping concentration of the drift region ($N_D$), as described by Equation (1) below.

$$N_D = 2 \times 10^{18} (BV_{pp})^{-4/3} \quad (1)$$

Equation (1) is a reproduction of Equation 8.18 from the aforementioned Baliga textbook. A graphical representation of breakdown voltage and depletion layer width ($W_{pp}$) at breakdown versus drift region doping ($N_D$) for an abrupt P-N junction rectifier is shown by FIG. 1. FIG. 1 is a reproduction of FIG. 3.4 from the aforementioned Baliga textbook.

In reality, however, the actual breakdown voltage of a Schottky rectifier is about one-third (⅓) that for the abrupt parallel-plane P-N junction described by Equation (1) and graphically illustrated by FIG. 1. As will be understood by those skilled in the art, the reduction in breakdown voltage below the parallel plane value is caused, in part, by image-force-induced lowering of the potential barrier between the metal and the semiconductor regions, which occurs at reverse-biased conditions.

One attempt to optimize the on-state voltage drop/reverse blocking voltage tradeoff associated with the Schottky barrier rectifier is the Junction Barrier controlled Schottky (JBS) rectifier. The JBS rectifier is a Schottky rectifier having an array of Schottky contacts at the face of a semiconductor substrate with corresponding semiconductor channel regions beneath the contacts. The JBS rectifier also includes a P-N junction grid interspersed between the Schottky contacts. This device is also referred to as a "pinch" rectifier, based on the operation of the P-N junction grid. The P-N junction grid is designed so that the depletion layers extending from the grid into the substrate will not pinch-off the channel regions to forward-biased currents, but will pinch-off the channel regions to reverse-biased leakage currents.

As will be understood by those skilled in the art, under reverse bias conditions, the depletion layers formed at the P-N junctions spread into the channel regions, beneath the Schottky barrier contacts. The dimensions of the grid and doping levels of the P-type regions are designed so that the depletion layers intersect under the array of Schottky contacts, when the reverse bias exceeds a few volts, and cause pinch-off. Pinch-off of the channels by the depletion layers causes the formation of a potential barrier in the substrate and further increases in the reverse-biased voltage are supported by the depletion layer, which then extends into the substrate, away from the Schottky barrier contacts. Accordingly, once a threshold reverse-biased voltage is achieved, the depletion layers shield the Schottky barrier contacts from further increases in reverse-biased voltage. This shielding effect prevents the lowering of the Schottky barrier potential at the interface between the metal contacts and semiconductor substrate and inhibits the formation of large reverse leakage currents.

The design and operation of the JBS rectifier is described in Section 8.4 of the above cited textbook and in U.S. Pat. No. 4,641,174 to coinventor Baliga, entitled Pinch Rectifier, the disclosures of which are hereby incorporated herein by reference. For example, as shown by FIG. 6 of the '174 patent, reproduced herein as FIG. 2, an embodiment of a pinch rectifier 200 comprises a plurality of Schottky rectifying contacts 232 formed by metal layer 230 and substrate 204 and a P-N junction grid formed by regions 234 and substrate 204. Unfortunately, the JBS rectifier typically possesses a relatively large series resistance and a relatively large forward voltage drop caused by the reduction in overall Schottky contact area dedicated to forward conduction. This reduction in area is necessarily caused by the presence of the P-N junction grid at the face of the substrate. In addition, large forward currents can cause large forward voltage drops and can lead to the onset of minority carrier conduction (i.e., bipolar), which limit the JBS's performance at high switching rates. Finally, although the reverse blocking voltage for the JBS may be somewhat higher than the reverse blocking voltage for a Schottky rectifier having an equivalent drift region doping ($N_D$), it does not achieve the level of reverse blocking capability obtainable with a parallel-plane P-N junction, as shown by FIG. 1.

Another attempt to optimize the forward voltage drop/reverse blocking voltage tradeoff is disclosed in U.S. Pat. No. 4,982,260 to Chang, coinventor Baliga and Tong, entitled Power Rectifier with Trenches, the disclosure of which is hereby incorporated by reference. For example, as shown by FIGS. 10B and 14B, reproduced herein as FIGS. 3 and 4, respectively, conventional P-i-N rectifiers ($P^+$-$N^-$-$N^+$) are modified to include an interspersed array of Schottky contacts on a face of an N-type semiconductor substrate. As shown by FIG. 3, the Schottky contact regions 550A-C are separated from the P+ portions 510A-D (of the P-i-N rectifier) by MOS trench regions 522A-522F. In another embodiment shown by FIG. 4, the Schottky contact regions 718A-E are interspersed adjacent the P+ portions 720A-F, which are formed at the bottom of trenches 710A-F. As will be understood by those skilled in the art, these modified P-i-N rectifiers also typically possess an unnecessarily large series resistance in the drift region ($N^-$-type regions 506, 706). Moreover, only a relatively small percentage of forward-conduction area is dedicated to the Schottky contacts, which dominate the forward bias characteristics by turning on at lower forward voltages than the parallel connected P+-N junctions. Finally, although the forward leakage current for these P-i-N type rectifiers is substantially lower than corresponding forward leakage current for a Schottky rectifier, like the JBS, they do not achieve the level of reverse blocking capability associated with an abrupt parallel-plane P-N junction.

A MOS barrier Schottky (MBS) rectifier has also been proposed to allow for unipolar conduction at forward voltage drops greater than 0.5 Volts and at forward unipolar current densities greater than those obtainable using the JBS rectifier, described above. In particular, this MBS rectifier was described in an article entitled New Concepts in Rectifiers, Proceedings of the Third International Workshop on the Physics of Semiconductor Devices, Nov. 27–Dec. 2, World Scientific Publications, Madras, India, 1985, by coinventor Baliga. As shown by the performance simulation curves of FIG. 5 of that article, ideal reverse blocking voltages on the order of 150–1200 volts represent the theoretical limit for an MBS rectifier having a relatively high forward voltage drop greater than about 0.5 volts. The simulation curves of FIG. 5 were based on Equations 8.14 and 8.18 of the aforementioned Baliga textbook. Accordingly, the curves of FIG. 5 assume ideal Schottky rectifier behavior and, as noted above, do not take into account effects such as image-force-induced lowering of the potential barrier between the metal and the drift region.

Thus, notwithstanding these developments, there continues to be a need for a Schottky rectifier having low forward voltage drop and high reverse blocking capability, and preferably a Schottky rectifier having an ideal or near ideal parallel-plane blocking voltage.

SUMMARY OF THE INVENTION

It is therefore an object of the present invention to provide a Schottky rectifier for low power supply applications, and a method of fabricating same.

It is also an object of the present invention to provide a Schottky rectifier capable of sustaining high forward biased current densities with low forward voltage drop, and a method of fabricating the same.

It is another object of the present invention to provide a Schottky rectifier capable of sustaining high reverse blocking voltages, and a method of fabricating the same.

It is still another object of the present invention to provide a Schottky rectifier capable of sustaining ideal or higher than ideal parallel-plane reverse blocking voltages, and a method of fabricating the same.

These and other objects are provided according to the present invention, by a Schottky rectifier having a cathode region and a drift region thereon, in a semiconductor substrate such as silicon. The drift region is relatively highly doped in order to reduce the forward voltage drop at high forward biased current densities. However, in order to provide a rectifier which also has high blocking voltages, the present invention includes means, in the drift region, for increasing the reverse blocking voltage of the Schottky rectifier above the reverse blocking voltage of a corresponding ideal parallel-plane abrupt P-N junction rectifier.

In particular, the present invention provides a Schottky rectifier having a plurality of spaced apart trenches in the drift region. The trenches define at least one mesa, having a predetermined mesa width and predetermined mesa doping concentration. According to the invention, high reverse blocking voltages can be achieved using a mesa having a doping concentration greater than $1 \times 10^{16}/cm^3$, and wherein the product of the mesa doping concentration and mesa width is less than or equal to $5 \times 10^{12}/cm^2$. Unexpectedly, the geometry of the rectifier in combination with the doping level can be manipulated to provide better performance than conventional devices. Thus, while providing a Schottky rectifier with a relatively high drift region doping concentration would typically cause a relatively low reverse blocking voltage, the present invention includes means for increasing the reverse-blocking voltage to ideal or higher than ideal values, even for doping concentrations greater than about $1 \times 10^{16}/cm^3$.

One embodiment of the present invention comprises a semiconductor substrate having first and second opposing faces. The substrate includes a cathode region of first conductivity type extending to the first face and a drift region of first conductivity type on the cathode region. The drift region extends to the second face and first and second trenches are formed in the drift region, at the second face. The trenches, which typically include sidewalls extending parallel to each other, define a mesa in the drift region. The mesa is preferably of stripe, rectangular or circular shape. First and second insulating regions are also formed on the trench sidewalls.

In addition, an anode electrode is formed on the second face and on the first and second insulating regions. The anode electrode forms a Schottky rectifying contact with the mesa at the second face. Since the anode electrode is also formed on the insulating regions and extends into the adjacent trenches, the application of a potential bias to the anode electrode not only effects conduction at the anode electrode/mesa interface on the second face, but also effects the electric field profile in the mesa, beneath the interface. While not wishing to be bound by any theory, it is believed that the unexpected shape of the electric field distribution in the mesa causes the rectifier to be less susceptible to reverse biased breakdown and, in fact, causes the reverse blocking voltage to exceed the corresponding ideal parallel-plane reverse blocking voltage. For example, a Schottky rectifier according to the present invention, having a drift region doping of $1 \times 10^{17}/cm^3$, was fabricated and tested and showed a reverse blocking voltage of greater than fifteen (15) volts. The expected blocking voltage for a similarly doped parallel-plane abrupt P-N junction was only 9.5 volts.

Finally, instead of forming trenches in the drift region to define a mesa therebetween, the mesa may also be formed as extensions of the drift region using conventional techniques such as selective epitaxial growth (SEG). In this embodiment, insulating regions such as $SiO_2$ can be formed on the sides of the mesa using conventional growth or deposition techniques.

DETAILED DESCRIPTION OF A PREFERRED EMBODIMENT

The present invention now will be described more fully hereinafter with reference to the accompanying drawings, in which a preferred embodiment of the invention is shown. This invention may, however, be embodied in many different forms and should not be construed as limited to the embodiment set forth herein; rather, this embodiment is provided so that this disclosure will be thorough and complete, and will fully convey the scope of the invention to those skilled in the art. Like numbers refer to like elements throughout.

Figure 1:
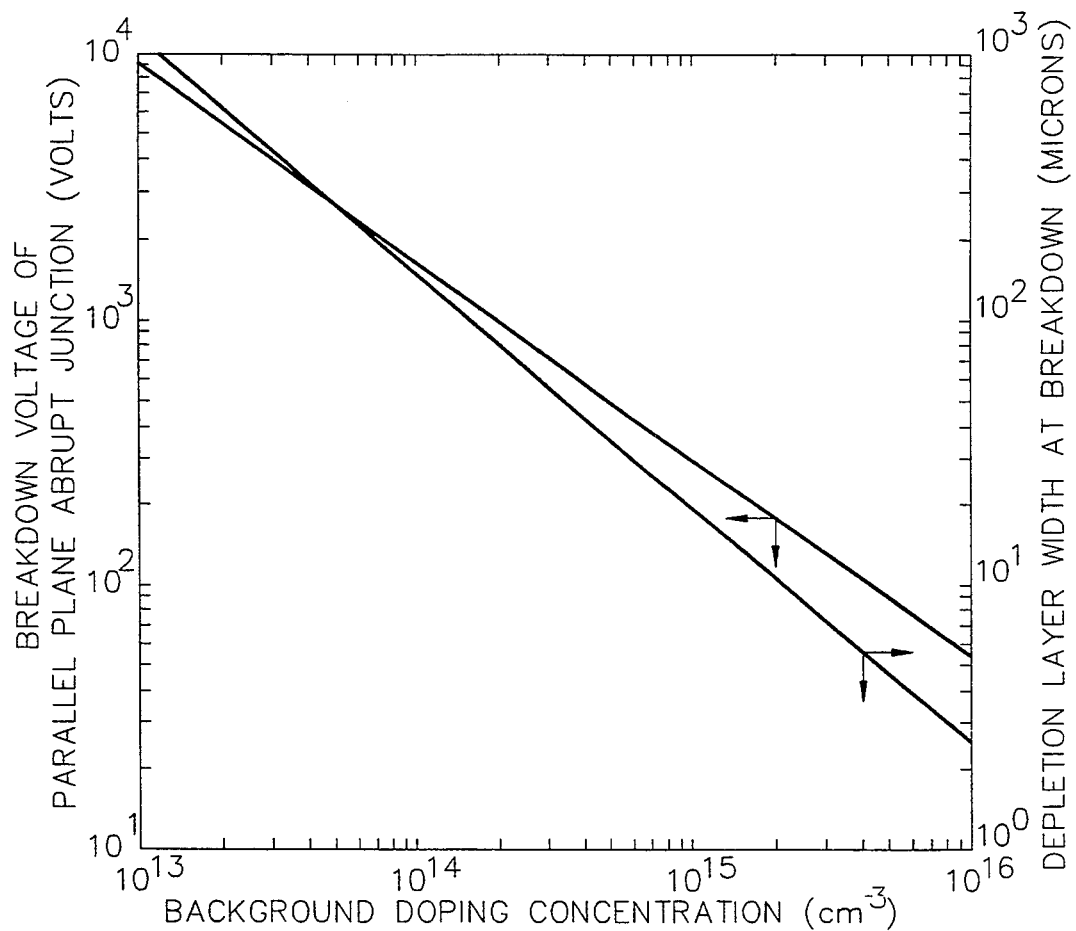
FIG. 1 is a graphical illustration of breakdown voltage and depletion layer width versus doping concentration for a parallel-plane abrupt P-N junction.
Figure 2:
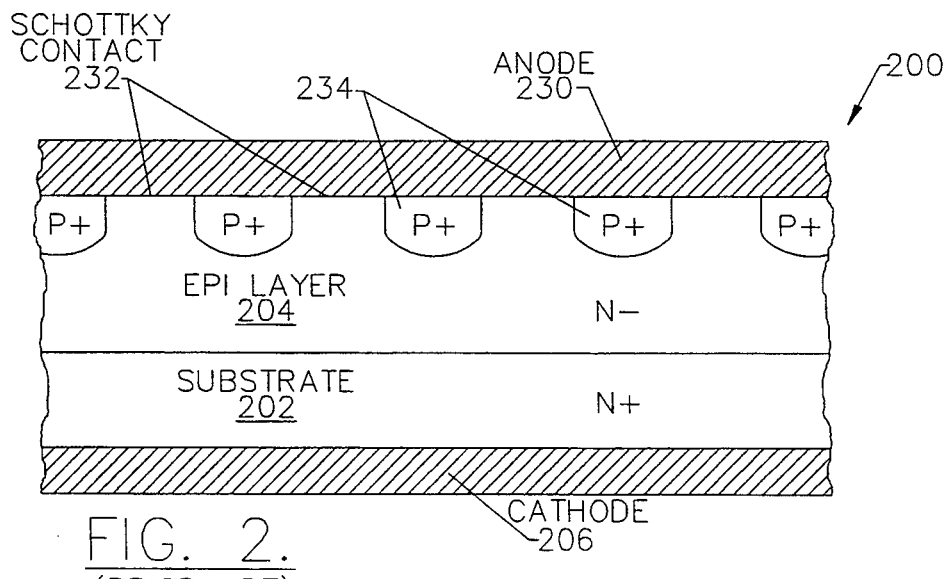
FIG. 2 illustrates a cross-sectional representation of a prior art pinch rectifier, according to FIG. 6 of U.S. Pat. No. 4,641,174.
Figure 3:
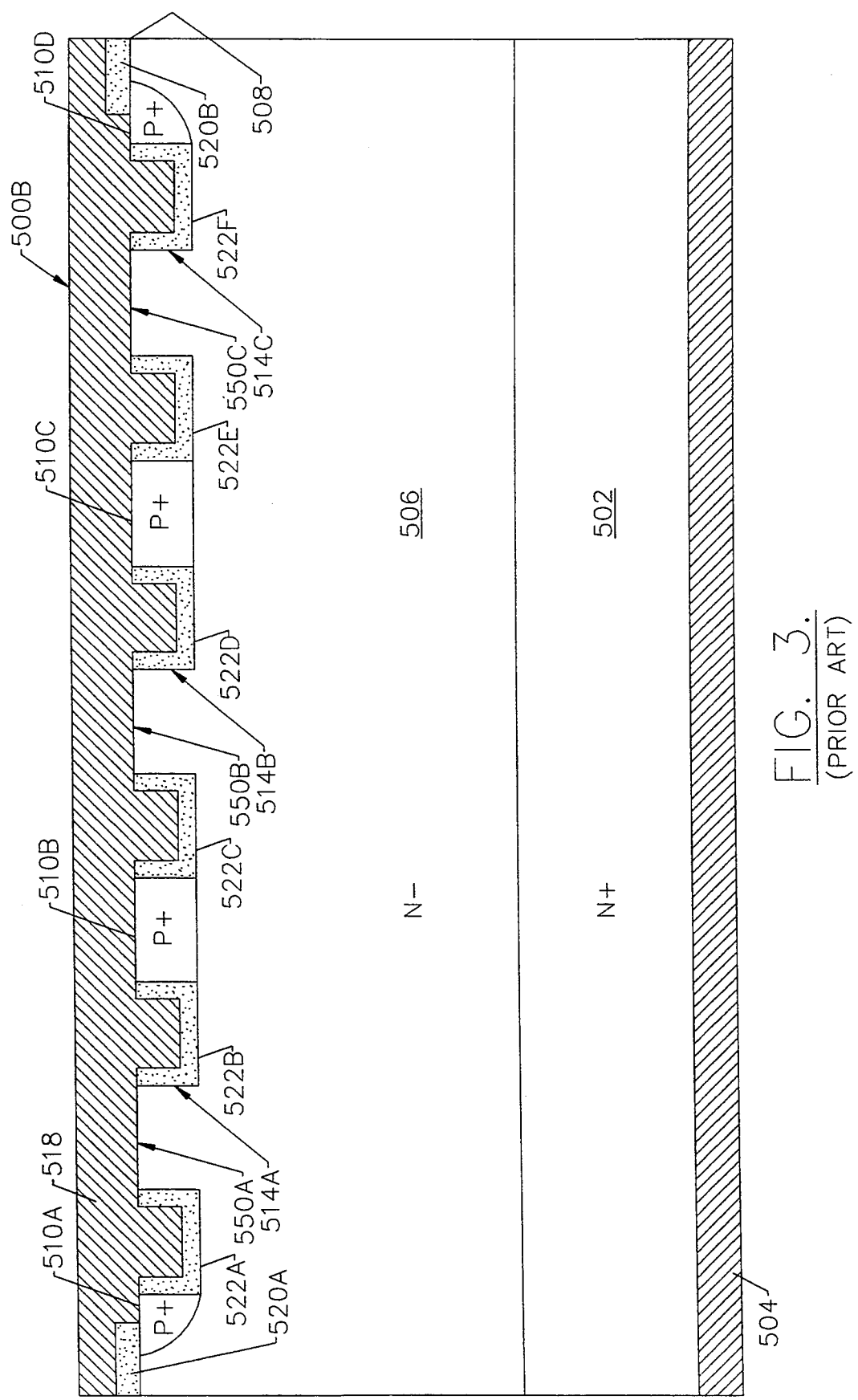
FIG. 3 illustrates a cross-sectional representation of a prior art P-i-N rectifier, according to FIG. 10B of U.S. Pat. No. 4,982,260.
Figure 4:
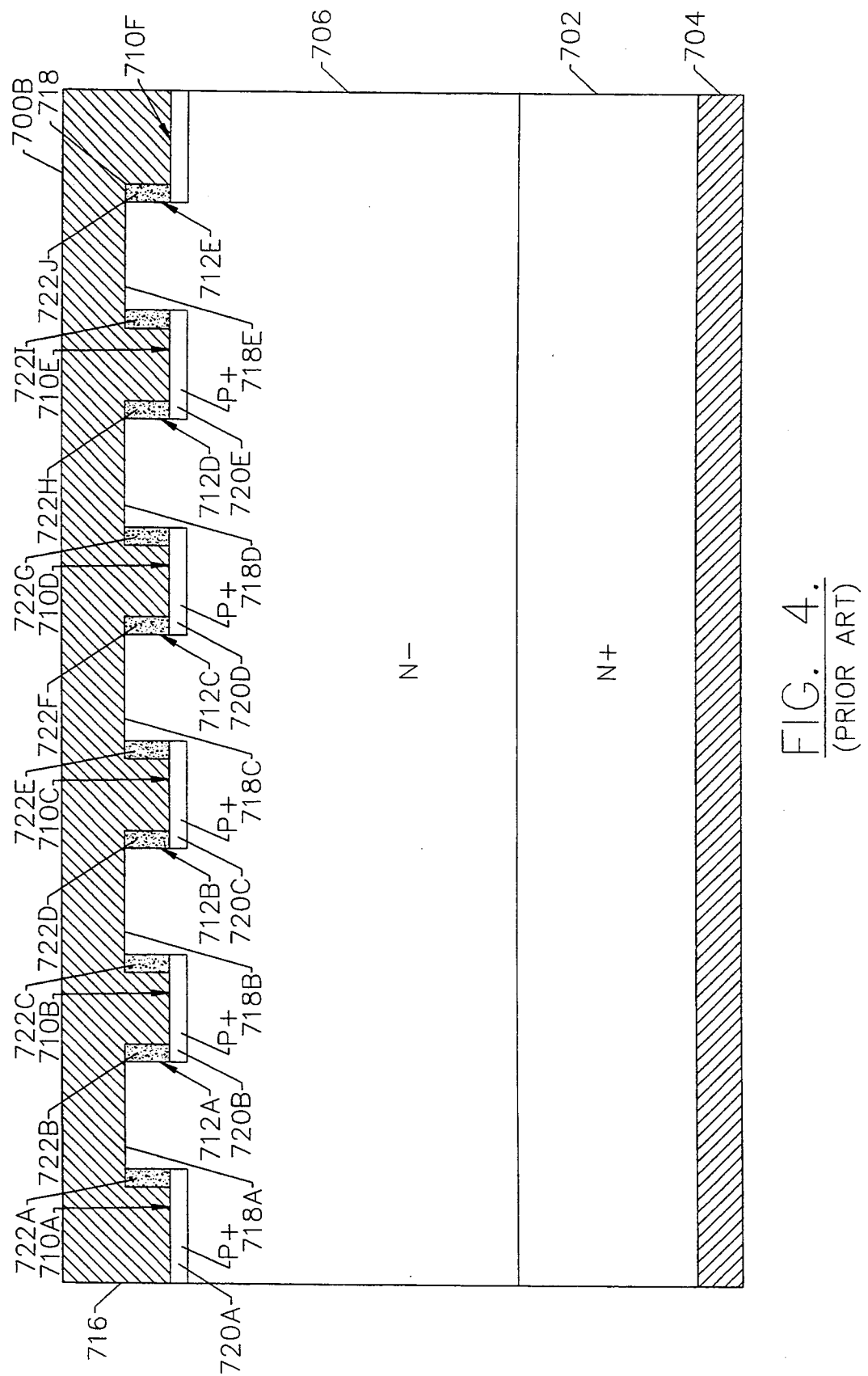
FIG. 4 illustrates a cross-sectional representation of a prior art P-i-N rectifier, according to FIG. 14B of U.S. Pat. No. 4,982,260.
Figure 5:
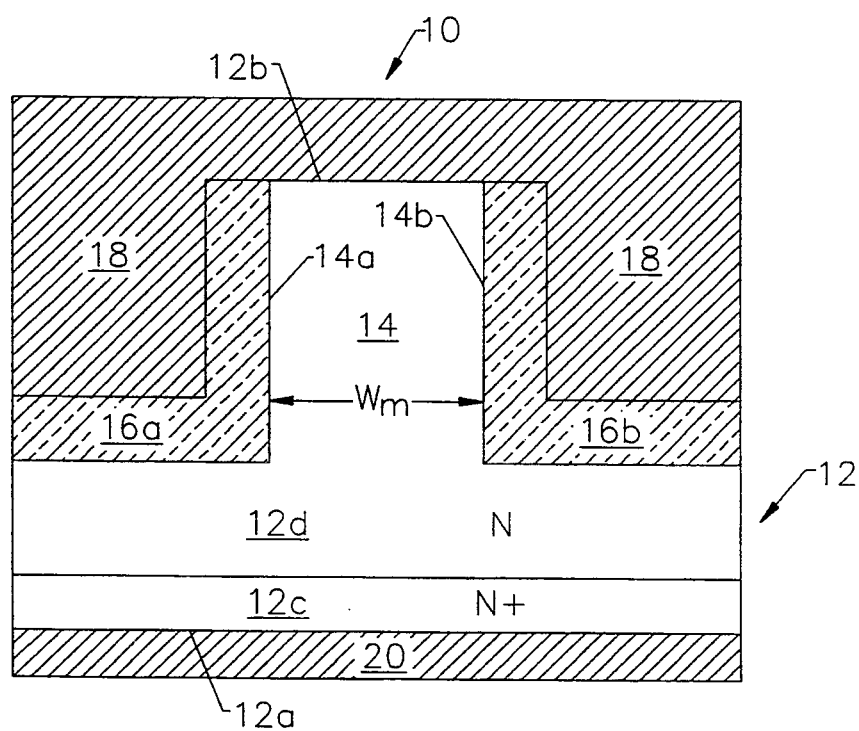
FIG. 5 illustrates a cross-sectional view of a first embodiment of a trench MOS Schottky barrier rectifier (TMBR) according to the present invention.

Referring now to FIG. 5, a cross-sectional illustration of a trench MOS Schottky barrier rectifier according to the present invention is shown. The rectifier 10 includes a semiconductor substrate 12 of first conductivity type, typically N-type conductivity, having a first face 12a and a second opposing face 12b. The substrate 12 preferably comprises a relatively highly doped cathode region 12c (shown as N+) adjacent the first face 12a. A drift region 12d of first conductivity type (shown as N) preferably extends from the cathode region 12c to the second face 12b. Accordingly, the doping concentration of the cathode region is preferably greater than the drift region. A mesa 14 having a cross-sectional width "$W_m$", defined by opposing sides 14a and 14b, is preferably formed in the drift region 12d. The mesa can be of stripe, rectangular, cylindrical or other similar geometry. Insulating regions 16a and 16b (shown as $SiO_2$) are also provided on the mesa sides. The rectifier also includes an anode electrode 18 on the insulating regions 16a, 16b. The anode electrode 18 forms a Schottky rectifying contact with the mesa 14. The height of the Schottky barrier formed at the anode electrode/mesa interface is dependent not only on the type of electrode metal and semiconductor (e.g., Si, Ge, GaAs, and SiC) used, but is also dependent on the doping concentration in the mesa 14. Finally, a cathode electrode 20 is provided adjacent the cathode region 12c at the first face 12a. The cathode electrode 20 ohmically contacts the cathode region 12c.

Figure 7:
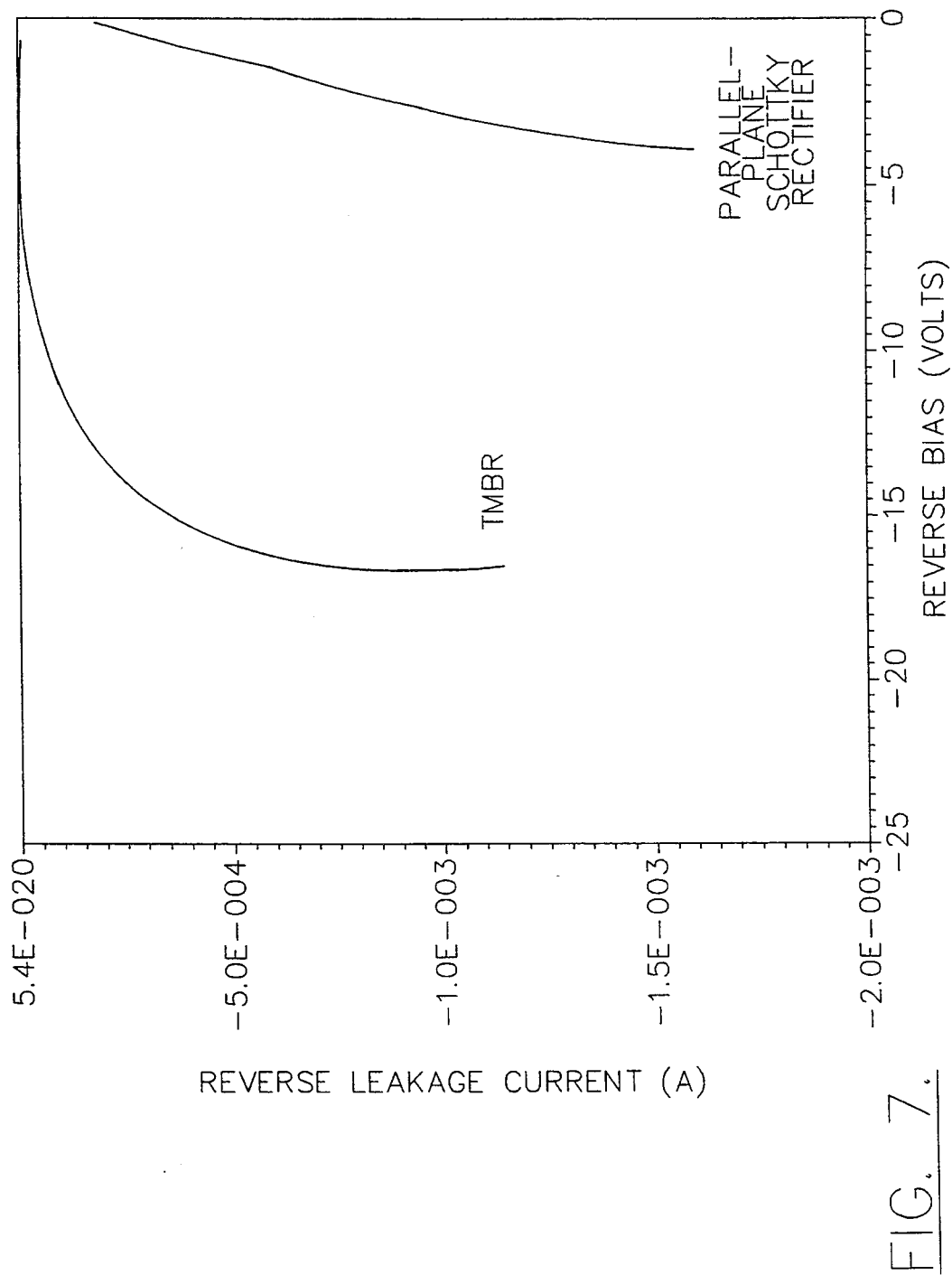
FIG. 7 is a graphical illustration of experimental results comparing reverse leakage current versus reverse bias for a parallel-plane Schottky rectifier and a trench MOS Schottky barrier rectifier according to the present invention.

As will be understood by one skilled in the art, because the anode electrode 18 is formed on the insulating regions 16a, 16b adjacent the mesa sides 14a, 14b, the application of a potential bias to the anode electrode not only effects conduction at the anode electrode/mesa interface on the second face 12b, but also renders the rectifier 10 less susceptible to reverse-biased breakdown, and has been shown to cause the reverse blocking voltage of the present invention to exceed the corresponding ideal parallel-plane blocking voltage for an abrupt P-N junction. Based on experimental testing, as shown by FIG. 7, a trench MOS Schottky barrier rectifier having a drift region doping concentration of $1 \times 10^{17}/cm^3$ showed a reverse blocking voltage of greater than fifteen (15) volts, compared to 9.5 volts for a corresponding parallel-plane abrupt P-N junction.

Relatively high reverse blocking voltages are achieved even with drift region doping concentrations of greater than $1 \times 10^{16}/cm^3$. Furthermore, by selecting the mesa width "$W_m$" so that the product of the drift region doping concentration and the mesa width is less than or equal to $5 \times 10^{12}/cm^2$, better than ideal reverse blocking voltages are obtained for rectifiers according to the present invention with drift region doping concentrations greater than $1 \times 10^{16}/cm^3$.

Figure 6A:
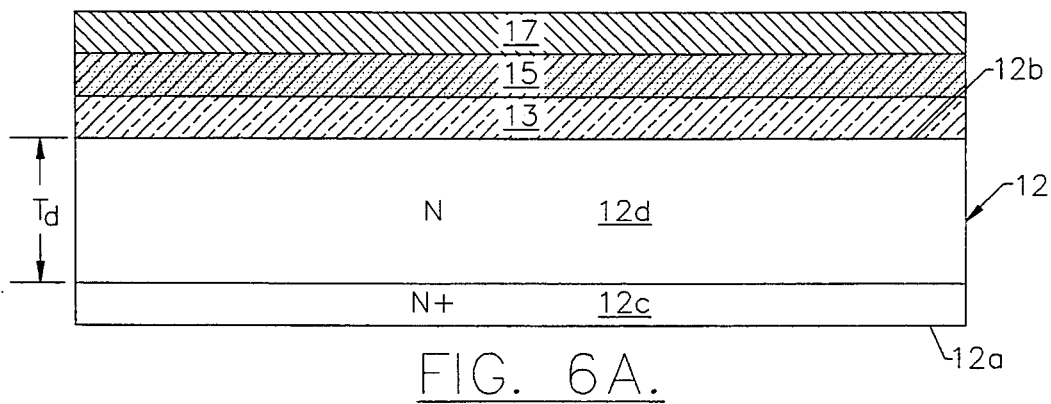
FIGS. 6A-6F are cross-sectional views of the structure of FIG. 5 during intermediate fabrication steps.
Figure 6B:
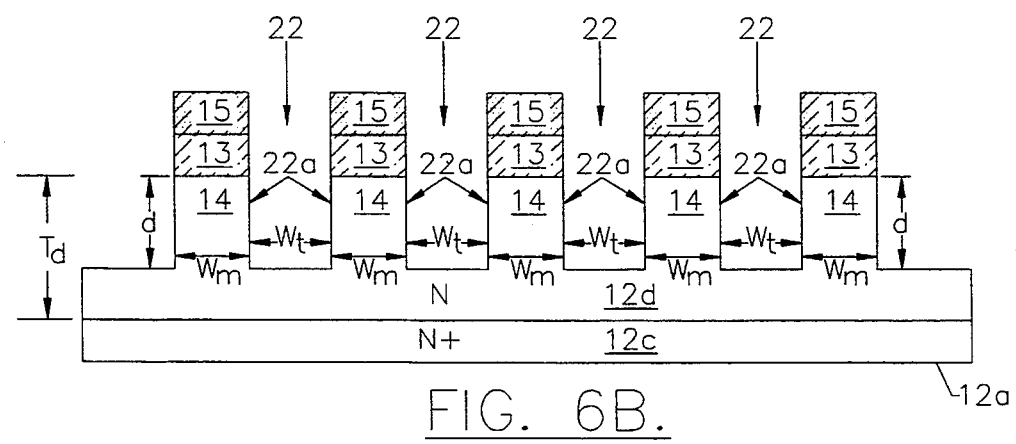

Referring now to FIGS. 6A–6F, a technique for fabricating the rectifier 10 of FIG. 5 will be described. Referring first to FIG. 6A, a substrate 12 having first and second opposing faces 12a and 12b is provided with a relatively highly doped cathode region 12c at face 12a, and a drift region 12d on the cathode region, extending to the second face 12b. As will be understood by one skilled in the art, the drift region 12d having thickness "$T_d$", may be provided by epitaxial growth using conventional techniques. A plurality of adjacent mesas 14 can be formed in the drift region 12d by initially providing a multilayered stack of oxide ($SiO_2$), nitride ($Si_3N_4$) and photoresist (regions 13, 15, and 17, respectively) on the second face 12b. Although the formation of the oxide regions 13 is not necessary, the oxide regions 13 are preferably made relatively thin, approximately 100 Å, to relieve interlayer stress between the semiconductor 12 and the nitride regions 15. Then, conventional lithographic patterning and etching steps can be performed to form discrete mesas 14 having thermal oxidation resistant nitride regions 15, as shown by FIG. 6b. Regions 15 are also chosen to be removable by an etch that does not etch $SiO_2$.

As will be understood by one skilled in the art, the etching step defines a plurality of first, second, third and fourth adjacent trenches 2, having respective trench widths "$W_t$" and trench depth "d", in the drift region 12d. If mesas 14 of stripe geometry are to be formed, the respective first, second, third and fourth trench sidewalls 22a will extend parallel to each other in a third direction orthogonal to the cross-sectional view (not shown). Alternatively, the patterning and etching steps can be performed to define rectangular, cylindrical or other similar geometries. However, because rectangular or cylindrical mesas occupy a comparatively smaller percentage of total forward conduction area for a given size substrate than mesa stripes of identical width, the forward voltage drop for rectifiers with rectangular or cylindrical mesas will likely be higher for a given forward current.

Figure 6C:
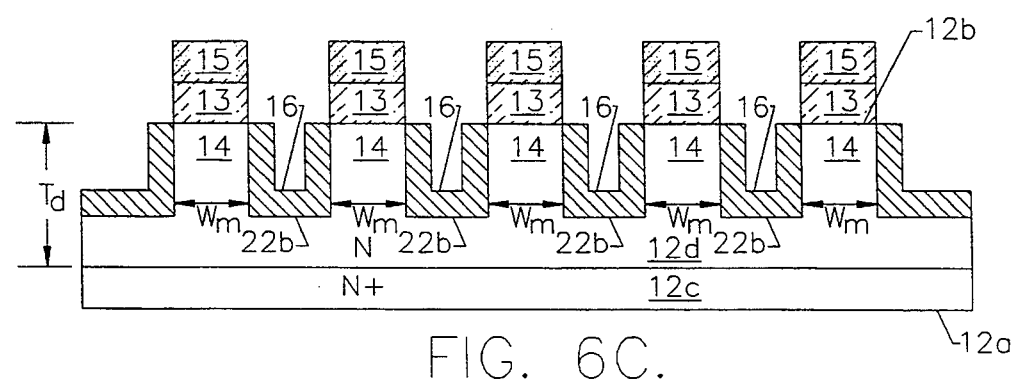
Figure 6D:
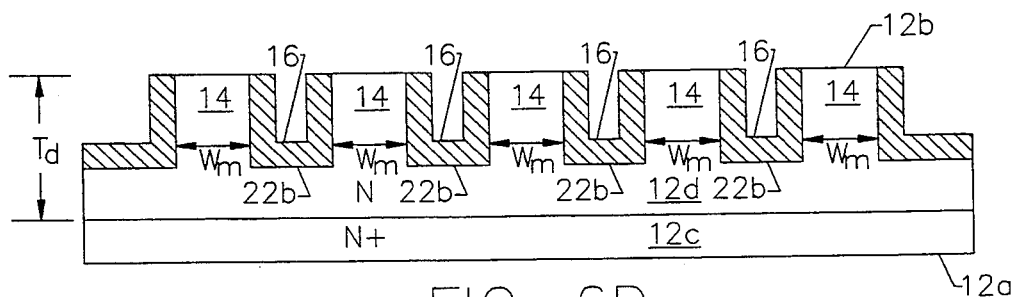
Figure 6E:
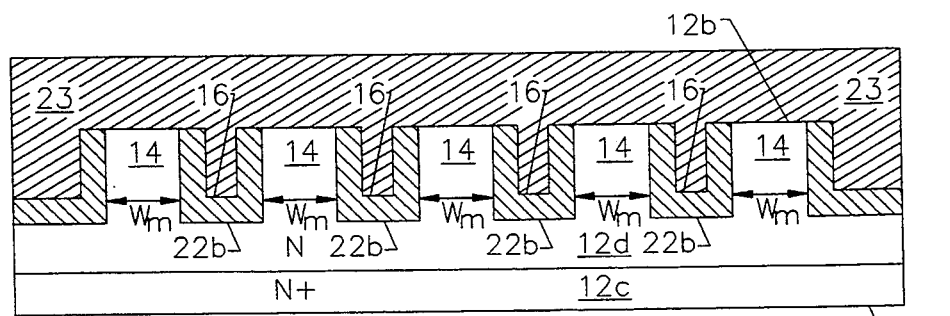
Figure 6F:
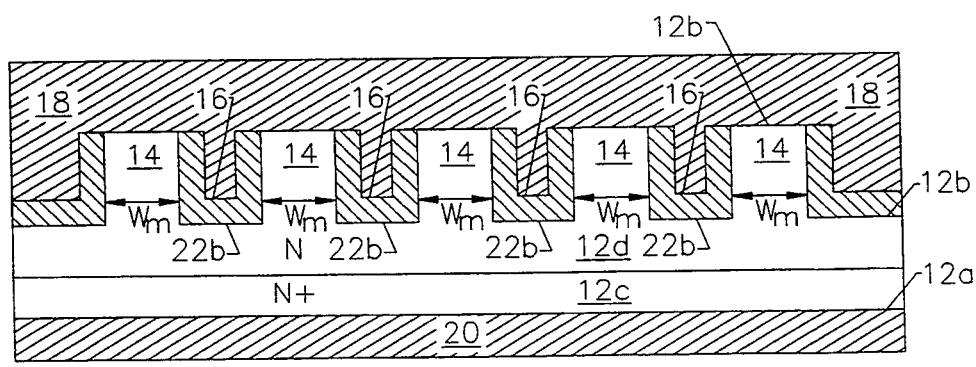

Referring now to FIG. 6C, respective first, second, third and fourth insulating regions 16 such as $SiO_2$ (approx. 1000 Å) can be formed on the trench sidewalls 22a and on the trench bottoms 22b, using conventional thermal oxide growth, but not on the face 12b because of the presence of the nitride regions 15. Next, the nitride regions 15 and stress relief oxide regions 13 (if present) are removed and top metallization 23 and metal patterning steps are performed to define the anode electrode 18 as shown by FIGS. 6D–6E. Finally, a backside metallization step is performed to define the cathode electrode 20 at the first face 12a as shown by FIG. 6F. Accordingly, for high current applications, a trench MOS Schottky barrier rectifier according to the present invention can be formed having a plurality of adjacent mesa regions 14 connected in parallel to a single anode electrode metallization layer 18 and cathode metallization layer 20.

As will be understood by one skilled in the art, although the above described process for forming a plurality of mesas with stripe geometry is preferred, other processes can also be used. For example, instead of forming trenches 22 to define the mesas 14, the mesas can be extensions of the drift region using conventional growth techniques such as selective epitaxial growth (SEG). In addition, the doping profiles of the mesas can be controlled in-situ in order to optimize the tradeoff between forward voltage drop and reverse blocking voltage for a particular rectifier application.

Accordingly, a semiconductor rectifier having low forward voltage drop and high reverse blocking voltage includes a semiconductor substrate 12 having first and second opposing faces 12a, 12b, a cathode region 12c of first conductivity type and drift region 12d of first conductivity type thereon. The rectifier also includes means, in the drift region, for increasing the reverse blocking voltage of the rectifier above the reverse blocking voltage of a corresponding ideal parallel-plane abrupt P-N junction rectifier. As described in reference to FIGS. 5 and 6A–6F, means for increasing the reverse blocking voltage preferably includes a plurality of trenches 22 in the drift region 12d, insulating regions 16 on the trench sidewalls 22a and an anode electrode 18 contacting a mesa(s) 14, defined between adjacent sidewalls. By setting the mesa doping concentration to a level above $1 \times 10^{16}/cm^3$ and by setting the product of the mesa(s) width "$W_m$" and mesa doping concentration to a value less than or equal to $5 \times 10^{12}/cm^2$, higher than expected blocking voltages can be obtained.

Figure 8:
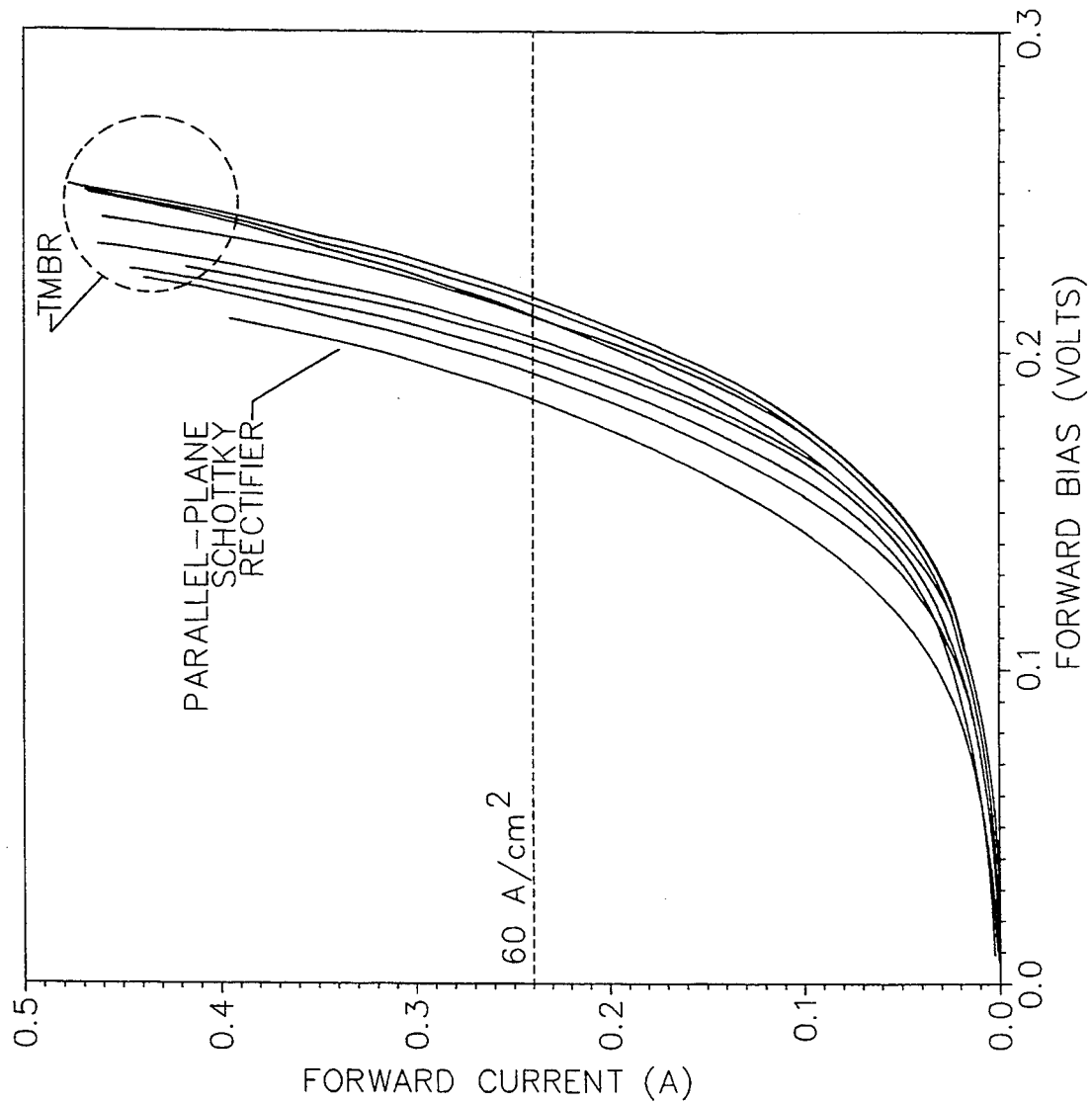
FIG. 8 is a graphical illustration of experimental results comparing forward current versus forward bias for a parallel-plane Schottky rectifier and a trench MOS Schottky barrier rectifier according to the present invention.

Referring now to FIG. 7, a graphical illustration of experimental results showing reverse leakage current versus reverse bias for a parallel-plane Schottky rectifier and for a trench MOS Schottky barrier rectifier (TMBR) according to the present invention, is provided. Both devices had drift region doping concentrations ($N_{drift}$) of $1 \times 10^{17}/cm^3$. For the TMBR, the mesa was of stripe geometry and had a mesa width "$W_m$" of 0.5 μm, trench width "$W_t$" of 0.5 μm and trench depth "d" of 2.0 μm. Accordingly, the pitch between adjacent trenches was 1.0 μm or twice the mesa width and the product of the doping concentration in the mesa and mesa width equaled $5 \times 10^{12}/cm^2$. As shown by FIG. 7, the TMBR achieved a breakdown voltage of greater than 15 volts, which was substantially greater than that for the parallel-plane Schottky rectifier (less than 5 volts) and corresponding parallel-plane abrupt P-N junction rectifier (9.5 volts). Referring now to FIG. 8, a graphical illustration of forward current versus forward bias voltage for the parallel-plane Schottky rectifier and for the trench MOS Schottky barrier rectifier (TMBR) of FIG. 7, is provided. Each of the TMBR curves corresponds to a rectifier having a mesa width and a doping concentration set to a predetermined value, so that the product of mesa width and doping concentration is less than $5 \times 10^{12}$ cm$^{-2}$.

Figure 9:
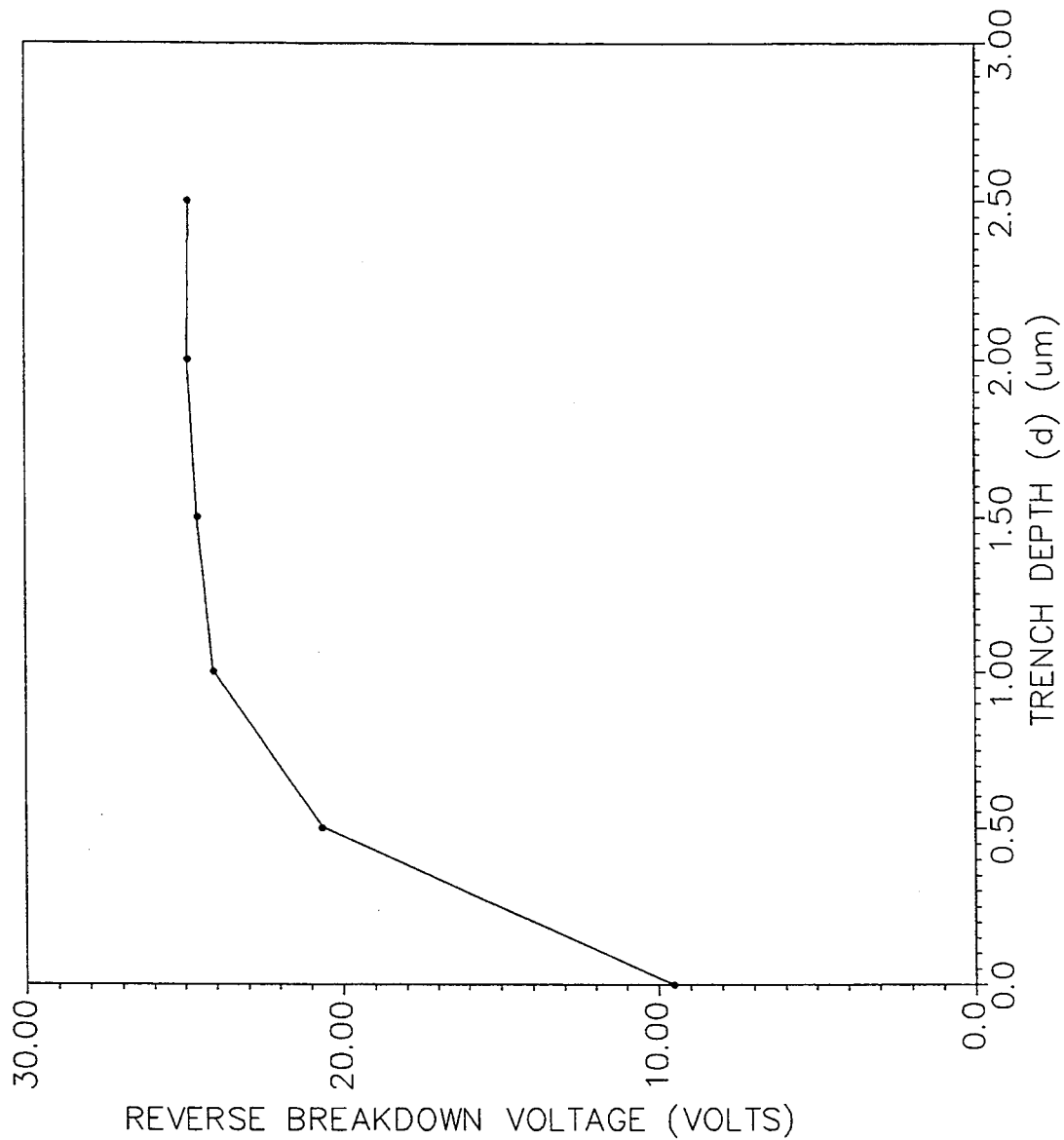
FIG. 9 is a graphical illustration of simulation results showing reverse breakdown voltage versus trench depth for a trench MOS Schottky rectifier according to the present invention.

Referring now to FIG. 9, a graphical illustration of simulated breakdown voltage versus trench depth "d" is provided, showing breakdown voltages of greater than twenty (20) volts for TMBR devices having trench depths greater than 0.5 μm. The simulated curve for the TMBR according to the present invention was based on a device having mesa width "$W_m$" of 0.5 μm, trench width of $W_t$=0.5 μm, insulating region thickness of 500 Å, drift region thickness of $T_d$=3.0 μm, drift region doping of $1 \times 10^{17}/cm^3$ and anode electrode work function potential of 4.77 eV.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. A semiconductor rectifier comprising:
   a semiconductor substrate having first and second opposing faces, said substrate having a cathode region of first conductivity type extending to said first face and a drift region of said first conductivity type extending to said second face, said drift region having a predetermined drift region doping concentration;
   a cathode electrode on said first face, ohmically contacting said cathode region;
   an anode electrode on said second face, said anode electrode forming a Schottky rectifying junction with said drift region at said second face; and
   means, in said drift region, for increasing the reverse blocking voltage of said Schottky rectifying junction above the reverse blocking voltage of an ideal parallel-plane abrupt P-N junction 2. The semiconductor rectifier of claim 1, wherein said means for increasing the reverse blocking voltage of the Schottky rectifying junction comprises:
   a first trench in said drift region at said second face, said first trench having a first sidewall; and
   a second trench in said drift region adjacent said first trench, said second trench having a second sidewall, adjacent said first sidewall, said first and second sidewalls defining a mesa in said drift region, having a predetermined mesa width from said first sidewall to said second sidewall;
   wherein said predetermined drift region doping concentration is greater than $1 \times 10^{16}$ dopants per cubic centimeter; and
   wherein the product of said predetermined drift region doping concentration and said predetermined mesa width is less than or equal to $5 \times 10^{12}$ per square centimeter.

3. The semiconductor rectifier of claim 2, wherein said cathode region has a predetermined cathode region doping concentration and wherein said drift region doping concentration is less than said cathode region doping concentration.

4. The semiconductor rectifier of claim 1, wherein said means for increasing the reverse blocking voltage of said Schottky rectifying junction comprises:
   a first trench in said drift region at said second face, said first trench having a first sidewall; and
   a second trench in said drift region adjacent said first trench, said second trench having a second sidewall, adjacent said first sidewall, said first and second sidewalls defining a mesa in said drift region; and
   wherein said predetermined drift region doping concentration is greater than $1 \times 10^{16}$ dopants per cubic centimeter.

5. A semiconductor rectifier comprising:
   a semiconductor substrate having first and second opposing faces, said substrate having a cathode region of first conductivity type extending to said first face and a drift region of said first conductivity type extending to said second face;
   a cathode electrode on said first face, ohmically contacting said cathode region;
   a first trench in said drift region at said second face, said first trench having a first sidewall in said drift region;
   a second trench in said drift region adjacent said first trench, said second trench having a second sidewall in said drift region, adjacent said first sidewall, said first and second sidewalls defining a mesa in said drift region, having a predetermined mesa width from said first sidewall to said second sidewall and having a predetermined mesa doping concentration;
   first and second insulating regions on said first sidewall and said second sidewall, respectively; and
   an anode electrode on said second face and on said first and said second insulating regions, said anode electrode forming a rectifying contact with said mesa at said second face;

wherein said predetermined mesa doping concentration is greater than $1 \times 10^{16}$ dopants per cubic centimeter; and wherein the product of said predetermined mesa doping concentration and said predetermined mesa width is less than or equal to $5 \times 10^{12}$ per square centimeter.

6. The semiconductor rectifier of claim 5, wherein said semiconductor substrate comprises silicon and wherein said first insulating region and said second insulating region comprise silicon dioxide.

7. The semiconductor rectifier of claim 6, wherein said first sidewall extends parallel to said second sidewall.

8. The semiconductor rectifier of claim 7, wherein said first trench has a first width equal to said predetermined mesa width and wherein said second trench has a second width equal to said predetermined mesa width.

9. The semiconductor rectifier of claim 6, wherein the distance between the center of said first trench and said second trench is twice said predetermined mesa width.

10. A semiconductor rectifier comprising:
a semiconductor substrate having first and second opposing faces, said substrate having a cathode region of first conductivity type extending to said first face;
a cathode electrode on said first face, ohmically contacting said cathode region;
a first trench in said substrate at said second face, said first trench having a first sidewall in said substrate;
a second trench in said substrate adjacent said first trench, said second trench having a second sidewall in said substrate, adjacent said first sidewall, said first and second sidewalls defining a mesa in said substrate, said mesa extending to said second face and having a predetermined mesa width from said first sidewall to said second sidewall;
a drift region of said first conductivity type in said substrate, extending between said cathode region and said second face and between said first and said second sidewalls, said drift region having a predetermined drift region doping concentration;
first and second insulating regions on said first sidewall and said second sidewall, respectively; and
an anode electrode on said second face and on said first and said second insulating regions, said anode electrode forming a rectifying contact with said mesa at said second face;
wherein said predetermined drift region doping concentration is greater than $1 \times 10^{16}$ dopants per cubic centimeter; and
wherein the product of said predetermined drift region doping concentration and said predetermined mesa width is less than or equal to $5 \times 10^{12}$ per square centimeter.

11. The semiconductor rectifier of claim 10, wherein said semiconductor substrate comprises silicon and wherein said first insulating region and said second insulating region comprise silicon dioxide.

12. The semiconductor rectifier of claim 11, wherein said first sidewall extends parallel to said second sidewall.

13. The semiconductor rectifier of claim 12, wherein said first trench has a first width equal to said predetermined mesa width and wherein said second trench has a second width equal to said predetermined mesa width.

14. The semiconductor rectifier of claim 11, wherein said cathode region has a predetermined cathode region doping concentration and wherein said drift region doping concentration is less than said cathode region doping concentration.

15. A semiconductor rectifier comprising:
a semiconductor substrate of first conductivity type having first and second opposing faces;
a first trench in said substrate at said second face, said first trench having a first sidewall;
a second trench in said substrate adjacent said first trench, said second trench having a second sidewall, adjacent said first sidewall, said first and second sidewalls defining a mesa having a predetermined mesa width from said first sidewall to said second sidewall and having a predetermined mesa doping concentration;
first and second insulating regions on said first sidewall and said second sidewall, respectively; and
an anode electrode on said second face and on said first and said second insulating regions, said anode electrode forming a rectifying contact with said mesa at said second face;
wherein said predetermined mesa doping concentration is greater than $1 \times 10^{16}$ dopants per cubic centimeter; and
wherein the product of said predetermined mesa doping concentration and said predetermined mesa width is less than or equal to $5 \times 10^{12}$ per square centimeter.

16. The semiconductor rectifier of claim 15 wherein said semiconductor substrate comprises silicon and wherein said first insulating region and said second insulating region comprise silicon dioxide.

17. The semiconductor rectifier of claim 16, wherein said first sidewall extends parallel to said second sidewall.

18. The semiconductor rectifier of claim 17, wherein said first trench has a first width equal to said predetermined mesa width and wherein said second trench has a second width equal to said predetermined mesa width.

* * * * *

UNITED STATES PATENT AND TRADEMARK OFFICE
CERTIFICATE OF CORRECTION

PATENT NO. : 5,365,102
DATED : November 15, 1994
INVENTOR(S) : Manoj Mehrotra; Bantval J. Baliga It is certified that error appears in the above-indentified patent and that said Letters Patent is hereby corrected as shown below:

Column 4 line 46, "AMOS" should be --A MOS--.

Column 8 line 17, "2" should be --22--.

Claim 1 (Column 10, line 7), after "junction" insert --rectifier having a region of first conductivity type and a more highly doped region of opposite conductivity type forming a P-N junction with said region of first conductivity type, and wherein the doping concentration of said region of first conductivity type equals said predetermined drift region doping concentration.--

Claim 9 (Column 11, line 21), "center" should be --centers--.

Signed and Sealed this

Twenty-eight Day of February, 1995

Attest:

BRUCE LEHMAN

Attesting Officer      Commissioner of Patents and Trademarks